US007495508B2

(12) United States Patent
Tan

(10) Patent No.: US 7,495,508 B2
(45) Date of Patent: Feb. 24, 2009

(54) SWITCHED CAPACITOR NOTCH FILTER CIRCUITS

(75) Inventor: Wenxiao Tan, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 11/716,835

(22) Filed: Mar. 12, 2007

(65) Prior Publication Data

US 2008/0224764 A1  Sep. 18, 2008

(51) Int. Cl.
*H03K 5/00* (2006.01)
(52) U.S. Cl. .................................. 327/554; 327/556
(58) Field of Classification Search ......... 327/551–559, 327/509–511, 336, 337
See application file for complete search history.

(56) References Cited

U.S. PATENT DOCUMENTS

| 4,417,214 | A | | 11/1983 | Sevastopoulos et al. | |
|---|---|---|---|---|---|
| 4,563,652 | A | * | 1/1986 | Hofer | 330/107 |
| 4,593,250 | A | * | 6/1986 | Lucas et al. | 330/107 |
| 4,957,778 | A | * | 9/1990 | Yrjala | 427/152 |
| 5,331,218 | A | * | 7/1994 | Moody et al. | 327/554 |
| 7,292,095 | B2 | * | 11/2007 | Burt et al. | 330/9 |

OTHER PUBLICATIONS

William R. Grise, "Applications of Switched-Capacitor Circuits in Active Filters and Instrumentation Amplifiers", The Technology Interface, the Electronic Journal for Engineering Technology, vol. 3, No. 3, Fall 1999, downloaded on Feb. 26, 2007, 20 pages.
"LMP100 High Performance Dual Switched Capacitor Filter", 1999 National Semiconductor Corporation, Jul. 1999, 28 pages.

* cited by examiner

*Primary Examiner*—Dinh T. Le
(74) *Attorney, Agent, or Firm*—Tum Thach; Wade J. Brady, III; Frederick J. Telecky, Jr.

(57) ABSTRACT

Switched capacitor notch filter circuits are disclosed. An example switched capacitor notch filter circuit described herein includes a switched capacitor amplifier to receive an input signal and a first feedback signal, to amplify the input signal and the first feedback signal, and to output an output signal, a first integrator to receive the output signal and a second feedback signal, to integrate the output signal and the second feedback signal, and to output the first feedback signal, a second integrator to receive the first feedback signal, to integrate the first feedback signal, and to output the second feedback signal, a sample and hold to receive the output signal, to periodically store a value of the output signal, and to output the value of the output signal, and a first switch to couple the sample and hold to the output signal when the sample and hold is to store the value of the output signal and to isolate the sample and hold from the output signal when the sample and hold is to output the value of the output signal.

18 Claims, 4 Drawing Sheets

SWITCHED CAPACITOR NOTCH FILTER CIRCUITS

FIELD OF THE DISCLOSURE

This disclosure relates generally to analog devices and, more particularly, to switched capacitor notch filters.

BACKGROUND

A notch filter receives an input signal and allows most frequencies to pass through the notch filter while attenuating frequencies in a specific range (i.e., in the notch) to very low levels. FIG. 1 is an illustration of a block diagram of a conceptual implementation of a notch filter 100 that is helpful in understanding the operation of a notch filter. The example conceptual implementation of the notch filter 100 includes a high pass filter 102 and a low pass filter 104. The high pass filter 102 transmits the input signal Vin above a certain frequency and contributes the high frequency portion of the input signal Vin to the output signal Vout. The low pass filter 104 transmits the input signal Vin below a certain frequency and contributes the low frequency portion of the input signal Vin to the output signal Vout. To attenuate a notch of the input signal Vin (e.g., to implement a notch filter), the high pass filter 102 is adjusted to pass frequencies that are slightly higher than the low pass filter 104 attenuates. In other words, when the signals from the high pass filter 102 and the low pass filter 104 are combined, a band of frequencies (e.g., a notch) from the input signal Vin are not included.

There are various difficulties in implementing a notch filter, both as a standalone circuit, such as on an integrated circuit (IC) chip, or integrated with many other circuits, such as on a system on a chip (SOC) IC. Variations in the circuit components cause variations in the frequency location of the notch. Precision amplifiers to reduce offsets consume substantial power, require extensive chip area, and are difficult to implement so that they are compatible with the other circuits on the chip and do not create excessive noise. Traditional notch filter are also incapable of providing a sufficiently high frequency notching frequency.

DETAILED DESCRIPTION

Figure 1:
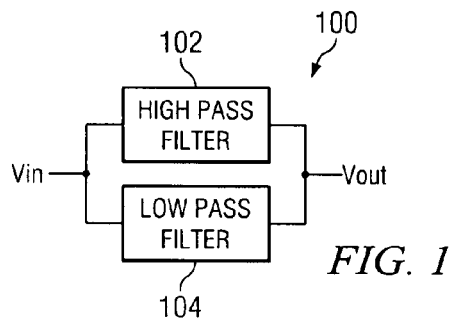
FIG. 1 is an illustration of a block diagram of a conceptual implementation of a notch filter 100 that is helpful in understanding the operation of a notch filter.

A switched capacitor technique with new circuit approaches is adopted to implement the example switched capacitor notch filter circuits described in this application. In an example implementation, errors in the frequency location of the notch are reduced by sampling the input using a first stage and filtering the input using a second stage while the second stage is isolated from the first stage. Implementing the notch filter using switched capacitors instead of impedances can reduce the size of the circuit in some implementations. Power consumption is reduced by not relying on large-precision amplifiers and by clocking and controlling the switches of the switched capacitor notch filter through accurate timing. Timing can be made accurate and yet high frequency so that a notch at a high frequency may be implemented. Noise performance of the switched capacitor is greatly reduced by introducing a switch that isolates the output from the switched capacitor notch filter circuit.

Impedances (e.g., resistors) can be approximated through the use of a switched capacitor. An example implementation of a switched capacitor comprises a first clock controlled switch, a second clock controlled switch, a third clock controlled switch, a fourth clock controlled switch, and a capacitor. A first side of the first clock controlled switch is connected to the signal input to the switched capacitor and a second side of the first clock controlled switch is connected to a first side of the second clock controlled switch and a first side of the capacitor (e.g., via a connection node). A second side of the second clock controlled switch is connected to a reference voltage (e.g., alternating current (AC) ground). A second side of the capacitor is connected to a first side of the third clock controlled switch and a first side of the fourth clock controlled switch. A second side of the third clock controlled switch provides the output of the example switched capacitor. A second side of the fourth clock controlled switch is connected to the reference voltage. The first clock controlled switch receives a first clock signal that is non-overlapping with a second clock signal applied to the second clock controlled switch. In other words, the first clock controlled switch is opened when the second clock controlled switch is closed and vice versa. The third clock controlled switch receives a third clock signal that is non-overlapping with a fourth clock control signal that controls the fourth switch. For example, the first clock signal may be phase shifted 180 degrees before being applied to the second clock controlled switch. The impedance of a switched capacitor is controlled by the clock frequency of the clock signal applied to the switches. The equivalent impedance of a switched capacitor is:

$$R_{eq} = \frac{1}{C \times f_{clk}}, \quad [1]$$

where C is the capacitance of the capacitor and $f_{clk}$ is the clock frequency controlling the first clock controlled switch and the second clock controlled switch. The equivalent impedance of the switched capacitor can be positive or negative depending on the switching relationship of the switched capacitor switches. For example, in the example switched capacitor described in this paragraph, the switched capacitor will provide the equivalent of a positive impedance when the second switch and the fourth switch are opened and closed together. The example switched capacitor will provide the equivalent of a negative impedance when the first switch and the fourth switch are opened and closed together.

A switched capacitor notch filter circuit as disclosed herein is capable of receiving an input alternating current (AC) signal and filtering out a frequency band from the signal. In other words, the switched capacitor notch filter circuit attenuates frequencies in the notched frequency bands to low levels relative to the frequencies that are not in the notched frequency bands. The example switched capacitor notch filter circuit is capable of operating with low noise even when a switching clock frequency applied to the switched capacitor notch filter circuit does not greatly exceed the notching frequency.

The switched capacitor notch filter circuit as disclosed herein may be used in any application where it is desired to filter a frequency band from a signal. For example, the switched capacitor notch filter circuit may be implemented in an integrated circuit (IC), on a semiconductor chip (e.g., a semiconductor chip providing a transistor implementation of circuit components), etc. each of which may or may not include other functions.

Figure 2:
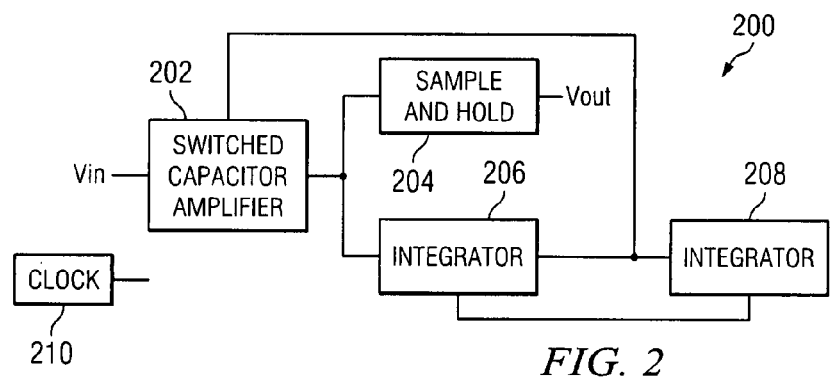
FIG. 2 is a block diagram of an example implementation of a switched capacitor notch filter circuit.

FIG. 2 is a block diagram of an example implementation of switched capacitor notch filter circuit 200. The example switched capacitor notch filter circuit 200 includes a sample and hold 204 and a switched capacitor notch filter comprising a switched capacitor amplifier 202, a first integrator 206, a second integrator 208, and a clock 210. The switch capacitor notch filter circuit 200 of the illustrated example receives an input signal Vin and outputs an output signal Vout. The example output signal Vout has a frequency band that is attenuated (e.g., notched out of the input signal Vin). An example circuit diagram implementation of the block diagram of FIG. 2 will be described in conjunction with FIG. 3.

The switched capacitor amplifier 202 of the illustrated example amplifies the input signal Vin and outputs the amplified signal to the sample and hold 204 and the integrator 206. Additionally, the switched capacitor amplifier 202 of the illustrated example receives a feedback signal from the integrator 206. The switched capacitor amplifier 202 applies direct current (DC) voltage gain to the input signal Vin. The switched capacitor amplifier 202 may include an internal clock signal to control the switching of the switched capacitors and/or may receive an external clock signal (e.g., from the clock 210).

The sample and hold 204 of the illustrated example repeatedly receives the amplified output of the switched capacitor amplifier 202, stores the signal for a predefined time, and outputs the stored signal during the predefined time. The sample and hold 204 of the illustrated example may include an internal clock signal to control the switching of the switched capacitors and/or may receive an external clock signal (e.g., from the clock 210).

The first integrator 206 of the illustrated example receives the amplified output of the switched capacitor amplifier 202 and a feedback signal from the second integrator 208 and outputs an integrated version of the signal. In general, the first integrator 206 acts as a low pass filter to the received signal when the input signal does not include an appreciable DC offset. The example first integrator 206 is a switched capacitor integrator; however, any other type of integrator may be used to implement the first integrator 206. The first integrator 206 of the illustrated example may include an internal clock signal to control the switching of the switched capacitors and/or may receive an external clock signal (e.g., from the clock 210).

The second integrator 208 of the illustrated example receives the integrated signal output from the first integrator 206 and outputs an integrated version of the signal. In general, the second integrator 208 acts as a low pass filter to the received signal when the input signal does not include an appreciable DC offset. The example second integrator 208 is a switched capacitor integrator; however, any other type of integrator may be used to implement the second integrator 208. The second integrator 208 of the illustrated example may include an internal clock signal to control the switching of the switched capacitors and/or may receive an external clock signal (e.g., from the clock 210).

The clock 210 of the illustrated example is connected to the switched capacitor amplifier 202, the sample and hold 204, the integrator 206, and the integrator 208. The example clock 210 provides control signals that controls the switches of the switched capacitor amplifier 202, the sample and hold 204, the integrator 206, and the integrator 208. The example clock 210 outputs multiple control signals that operate the various switches, which are described in further detail below, of the components of the switched capacitor notch filter circuit 200. While a single clock 210 is illustrated, persons of ordinary skill in the art will recognize that multiple clocks may be used.

Figure 3:
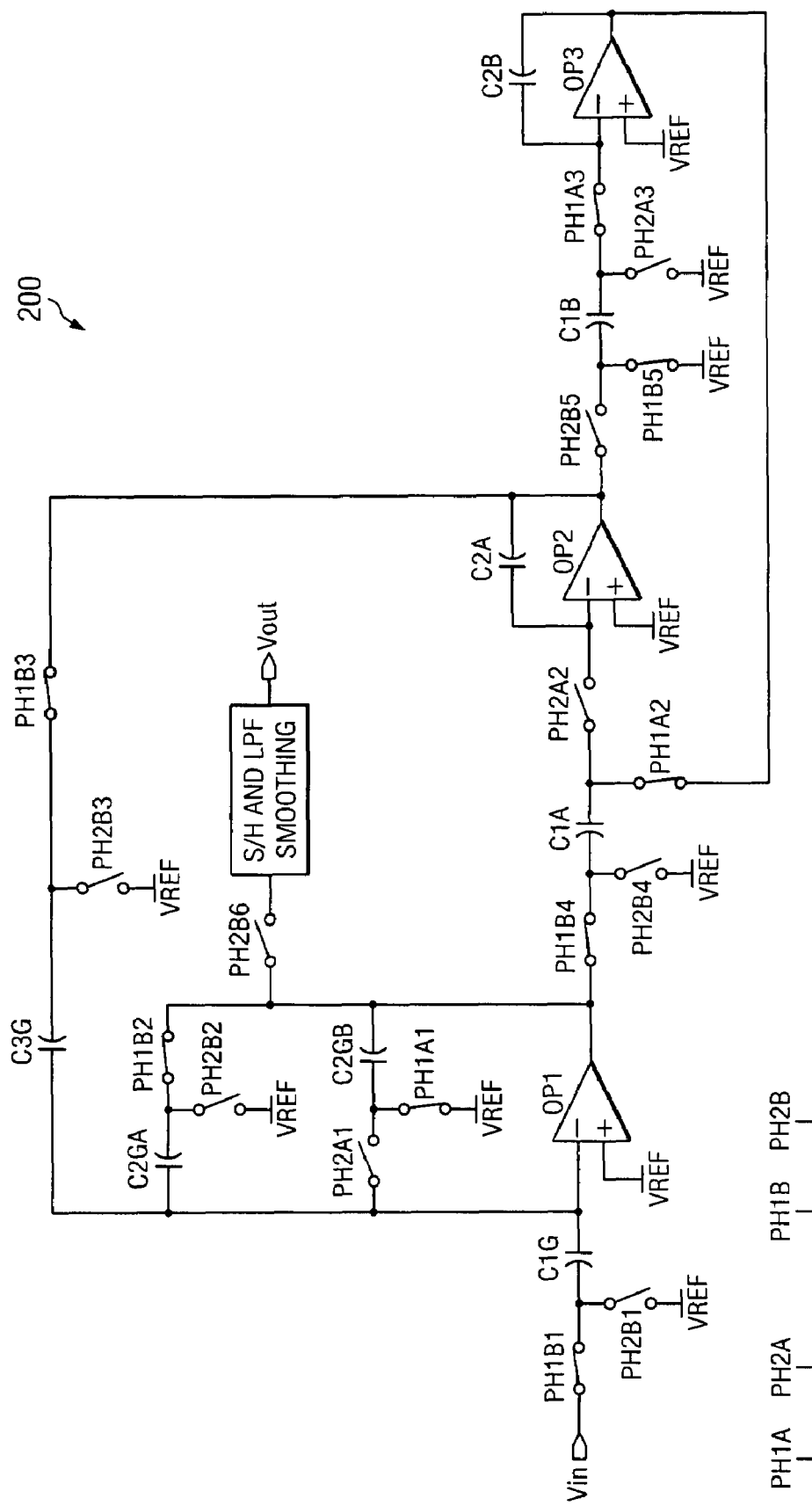
FIG. 3 is a circuit diagram of an example implementation of the switched capacitor notch filter circuit of FIG. 2.

FIG. 3 is a circuit diagram of an example implementation of the switched capacitor notch filter circuit 200 of FIG. 2. The example switched capacitor amplifier 202 of FIG. 2 is implemented by the switch PH1B1, the switch PH2B1, the capacitor C1G, the operational amplifier (opamp) OP1, the switch PH1A1, the switch PH2A1, the capacitor C2GB, the switch PH1B2, the switch PH2B2, the capacitor C2GA, the switch PH1B3, the switch PH2B3, and the capacitor C3G. The example sample and hold 204 is implemented by the switch PH2B6 and the sample and hold and low pass filter smoothing (SH/LPF) block 302. The example first integrator 206 is implemented by the switch PH1B4, the switch PH2B4, the capacitor C1A, the switch PH1A2, the switch PH2A2, the opamp OP2, and the capacitor C2A. The example second integrator 208 is implemented by the switch PH1B5, the switch PH2B5, the capacitor C1B, the switch PH1A3, the switch PH2A3, the opamp OP3, and the capacitor C2B.

The clock 210 of the illustrated example provides four clock control signals: PH1A, PH2A, PH1B, and PH2B. In the illustrated example, all switches labeled PH1Bx (where x is a reference character) are closed and opened at the same time (based on the control signal PH1B) and all switches labeled PH2By, are closed and opened at the same time (based on the control signal PH2B). All switches labeled PH1Ax (where x is a reference character) are closed and opened at the same time (based on the control signal PH1A) and all switches labeled PH2Ay, are closed and opened at the same time (based on the control signal PH2A). The switches labeled PH1Ax and PH2Ax are non-overlapping and are opened and closed at the same frequency but slightly ahead of the switches labeled PH1Bx and PH2Bx respectively. The switches labeled PH1Ax are opened when the switches labeled PH2Ax are closed and vice versa. The switches labeled PH1Bx are opened when the switches labeled PH2Bx are closed and vice versa. The clock 210 may include a clock generator. The clock generator receives the central clock signal of the clock 210 and time shifts the signal to generate the non-overlapping clocks (e.g., PH1B and PH2B respectively) and the non-overlapping clocks that operate slightly ahead (e.g., PH1A and PH2A respectively). For example, the clock signal PH1B (e.g., a square wave) will be time shifted so that it is high (e.g., the switch state is changed) when the clock signal PH2B is low. In addition, the clock signal PH1B will be shifted so that it is slightly behind the clock signal PH1A so that PH1Ax is operated slightly ahead of PH1Bx. An example implementation of a clock generator may use a series of inverters to introduce time delays and may use a feedback to ensure that the PH1x clocks are non-overlapping with the PH2x clocks.

In the illustrated example, all capacitors having the same first two reference characters (e.g., C1A and C1B, C2GA and C2GB, etc.) are implemented using capacitors having substantially similar capacitance values. The positive plate of the example capacitors is illustrated as a straight line and the negative plate is illustrated as a curved line, where the positive plate is assumed to have negligible or less parasitic capacitance than the negative plate.

The switch PH1B1, the switch PH2B1, and the capacitor C1G implement a switched capacitor. This switched capacitor is coupled with the input signal Vin via the switch PH1B1, is coupled with a reference voltage VREF via the switch PH2B1, and is coupled with an inverting input of the opamp OP1 via the capacitor C1G. The reference voltage VREF may be AC ground or may be any other voltage depending on a desired implementation. The operational characteristics of a switched capacitor are known to those of ordinary skill in the art and, thus, are not described in further detailed herein.

The inverting input of the opamp OP1 is coupled with the positive plate of the capacitor C1G, the switch PH2A1, the positive plate of the capacitor C2GA, and the positive plate of the capacitor C3G. The non-inverting input of the opamp OP1 is coupled with the reference voltage VREF. The output of the opamp OP1 is coupled with the negative plate of the capacitor C2GB, the switch PH1B2, the switch PH2B6, and the switch PH1B4. When the capacitor C2GA and the capacitor C2GB are smaller than the capacitor C1G, the output of the opamp OP1 includes an amplified and phase shifted (e.g., a 180 degree phase shifted) version of the input signal Vin minus the reference voltage VREF. When the capacitor C3G is larger than the capacitor C2GA and the capacitor C2GB, the output of the opamp OP1 also includes an amplified and phase shifted version of the signal attached to the feedback of the switched capacitor amplifier 202 minus the reference voltage VREF (e.g., the output of the opamp OP2).

The switch PH2A1 and the positive plate of the capacitor C2GA are coupled with the inverting input of the opamp OP1. The negative plate of the capacitor C2GB, the switch PH2B6, the switch PH1B4, and the switch PH1B2 are coupled with the output of the opamp OP1.

The switch PH1A1, the switch PH2A1, and the capacitor C2GB implement a switched capacitor and the switch PH1B2, the switch PH2B2, and the capacitor C2GA implement another switched capacitor. Together these two switched capacitors will reduce the gain and slew rate requirements of opamp OP1 and the equivalent input offset voltage of opamp OP1 will be negligible. The DC gain of the switched capacitor notch filter circuit 200 is controlled by the ratio of the capacitances of capacitor C1G to the capacitor C2GB and the capacitor C2GA.

The capacitor C3G, the switch PH1B3, and the switch PH2B3 implement a switched capacitor. The switch PH1B3 is coupled with the output of the opamp OP2 and the negative plate of the capacitor C2A. The positive plate of the capacitor C3G is coupled with the inverting input of the opamp OP1. The switched capacitor of the capacitor C3G implements a feedback loop to the opamp OP1.

The SH/LPF block 302 receives the output of the opamp OP1 based on the state of the switch PH2B6. The SH/LPF block 302 of the illustrated example includes a sample and hold circuit and a low pass filter circuit. The sample and hold circuit of the SH/LPF block 302 samples the output of the opamp OP1 when the switch PH2B6 is closed and holds the signal while the switch PH2B6 is open. The held signal is low pass filtered by the low pass filter of the SH/LPF block 302 before being output as output signal Vout. While the SH/LPF block 302 of the illustrated example includes a low pass filter to smooth the sampling edge of the output signal Vout and reduce switching noise in the output signal Vout, the low pass filter may be eliminated if such noise reduction is not desired. Because the SH/LPF block 302 is isolated from the input signal Vin (and the remainder of the switch capacitor notch filter circuit 200) by the switch PH2B6, the output signal Vout is not affected by disturbance from the input signal Vin (particularly in the attenuated notched frequency).

Turning to the example implementation of the first integrator 206, the switch PH1B4, the switch PH2B4, the switch PH1A2, the switch PH2A2, and the capacitor C1A implement a switched capacitor, which approximates a negative impedance for the first integrator 206. The switch PH1B4 is coupled with the output of the first opamp OP1. The capacitor C1A is coupled with an inverting input of the opamp OP2 when the switch PH2A2 is closed and is coupled with the feedback of the opamp OP3 when the switch PH1A2 is closed. The switch PH1A2 provides negative feedback when the capacitor C1A is charged (i.e., switch PH1B4 is closed and switch PH2B4 is open) because the switch PH1A2 and the switch PH2A2 are alternately opened and closed, as previously described.

The inverting input of the opamp OP2 is coupled with the switch PH2A2 and the positive plate of the capacitor C2A. The capacitor C2A provides an integration feedback loop from the output of the opamp OP2 to the inverting input of the opamp OP2. A non-inverting input of the opamp OP2 is connected to the reference voltage VREF. The output of the opamp OP2 is coupled with the negative plate of the capacitor C2A, the switch PH1B3, and the switch PH2B5.

Turning to the example implementation of the second integrator 208, the switch PH1B5, the switch PH2B5, the switch PH1A3, and the switch PH2A3, and the capacitor C1B implement a switched capacitor, which approximates a negative impedance for the second integrator 208. The switch PH2A3 is closed and the switch PH1A3 is opened when the capacitor C1B is to be charged (i.e., switch PH2B5 is closed and PH1B5 is open). The switch PH2A3 is open and the switch PH1A3 is closed when the charged capacitor C1B is to be coupled with the inverting input of the opamp OP3.

The inverting input of the opamp OP3 is coupled with the switch PH1A3 and the positive plate of the capacitor C2B. A non-inverting input of the opamp OP3 is coupled with the reference voltage VREF. The output of the opamp OP3 is coupled with the negative plate of the capacitor C2B and the negative feedback loop connected to the switch PH1A2. The capacitor C2B provides the integration feedback from the output of the opamp OP3 to the inverting input of the opamp OP3.

An analysis of switched capacitor notch filter circuit 200 of FIG. 3 reveals that the DC gain $A_{dc}$ is:

$$A_{dc} = -\frac{C1G}{C2G}, \quad [2]$$

where C1G is the capacitance of the capacitor C1G and C2G is the capacitance of capacitor C2GA and capacitor C2GB. The notching frequency $f_0$ of the switched capacitor notch filter circuit 200 is:

$$f_0 = \arcsin\left(\frac{C1}{2C2}\right) \times \frac{f_{clk}}{\pi}, \quad [3]$$

where C1 is the capacitance of the capacitor C1A and the capacitor C1B, C2 is the capacitance of the capacitor C2A and the capacitor C2B, the arcsin( ) result is in radians, and $f_{clk}$ is the switching clock frequency applied to the switches of the switch capacitor notch filter circuit 200. The two −3 dB poles $f_l$ and $f_h$ of the switched capacitor notch filter circuit 200 are:

$$f_{l,h} = \arcsin\left[\frac{C1}{2C2} \times \sqrt{\frac{2 + \left(\frac{C3G}{C2G}\right)^2 + \frac{C3G}{C2G} \times \frac{C1}{C2} \mp \frac{C3G}{C2G}\sqrt{\left(\frac{C3G}{C2G} + \frac{C1}{C2}\right)^2 + 4}}{2 \times \left(1 + \frac{C3G}{C2G} \times \frac{C1}{C2}\right)}}\right] \times \frac{f_{clk}}{\pi} \quad [4]$$

where C1 is the capacitance of the capacitor C1A and the capacitor C1B, C2 is the capacitance of the capacitor C2A and the capacitor C2B, C2G is the capacitance of the capacitor C2GA and the capacitor C2GB, C3G is the capacitance of the capacitor C3G, the arcsin( ) result is in radians, and $f_{clk}$ is the switching clock frequency applied to the switches of the switch capacitor notch filter circuit 200. The quality factor Q of the switched capacitor notch filter circuit 200 is:

$$Q = \frac{f_o}{f_h - f_l}. \quad [5]$$

The output offset voltage of the switch capacitor notch filter circuit 200 is the root mean square (RMS) summation:

$$V_{osh} + \left(\frac{C3G}{C2G} \times V_{os3}\right), \quad [6]$$

where C3G is the capacitance of the capacitor C3G, C2G is the capacitance of the capacitor C2GA and the capacitor C2GB, $V_{osh}$ is the offset voltage due to the sample and hold circuit and $V_{os3}$ is the input referred offset voltage of opamp OP3.

As illustrated in the forgoing equations 2 to 6, the notching frequency can be selected or made programmable by adjusting the capacitance of the capacitor C1A and the capacitor C1B. The error effect on the notching frequency due to charge injection, clock feed through, and layout parasitic capacitors can be reduced by the fine trimming (e.g., fine trimming bits may be added) the capacitance of the capacitor C2A and the capacitor C2B. The quality factor of the switched capacitor notch filter circuit 200 can be tuned by adjusting the ratio of capacitor C3G to the capacitance of the capacitor C2GA and the capacitor C2GB.

Figure 4:
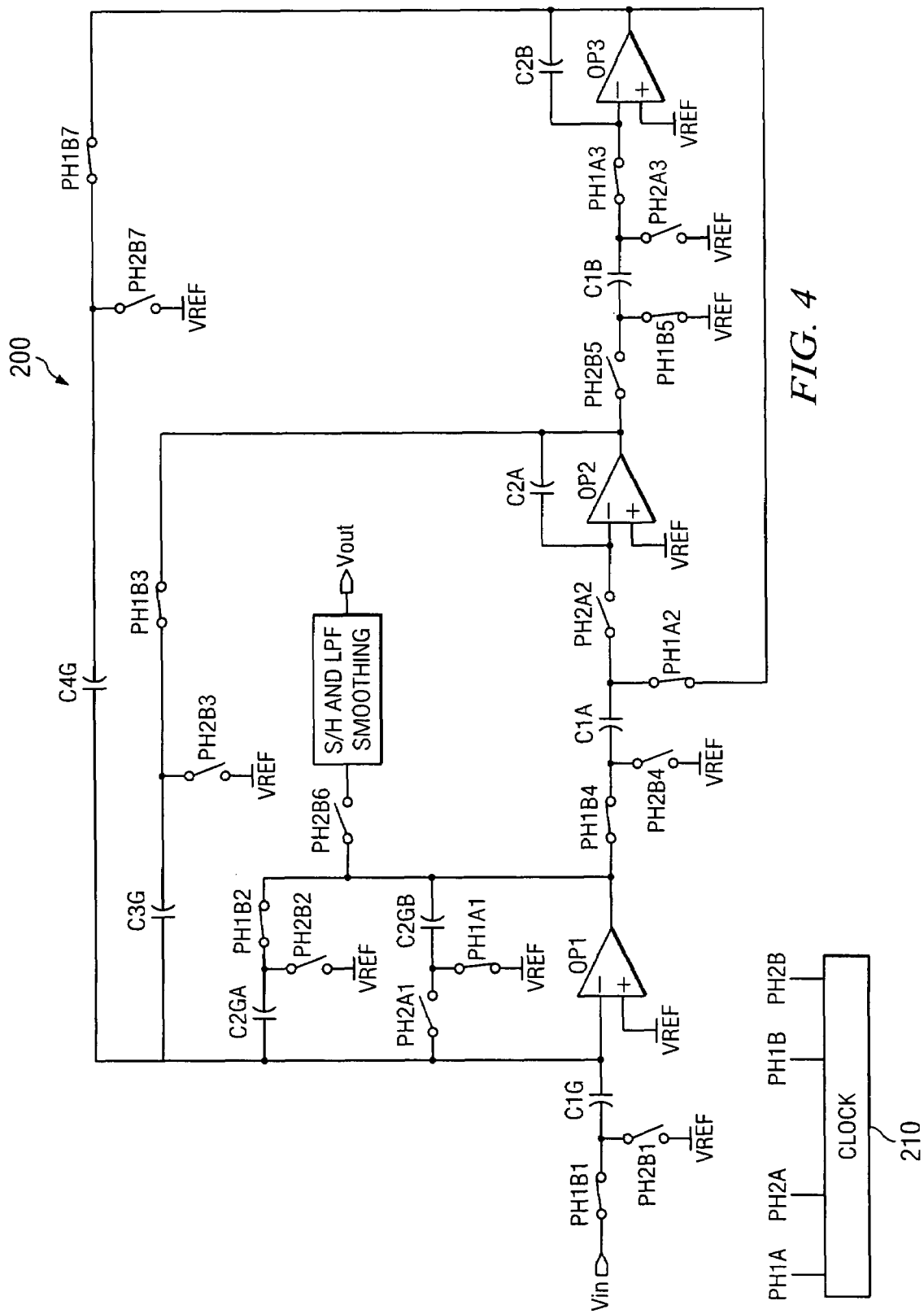
FIG. 4 is a circuit diagram of an example implementation of the switched capacitor notch filter circuit of FIG. 2 including an additional feedback loop.

FIG. 4 is a circuit diagram of an example implementation of the switched capacitor notch filter circuit 200 of FIG. 2 including an additional feedback loop. The circuit of FIG. 4 includes all of the components of FIG. 3 and additionally includes a capacitor C4G, a switch PH1B7, and a switch PH2B7. The capacitor C4G, the switch PH1B7, and the switch PH2B7 implement a switched capacitor. The switch PH1B7 is coupled with the output of the opamp OP3 (described in conjunction with FIG. 3). The capacitor C4G is coupled with the inverting input of the opamp OP1 (described in conjunction with FIG. 3). The circuit of FIG. 4 provides a different gain, notching frequency, and quality factor than the implementation of FIG. 3.

Figure 5:
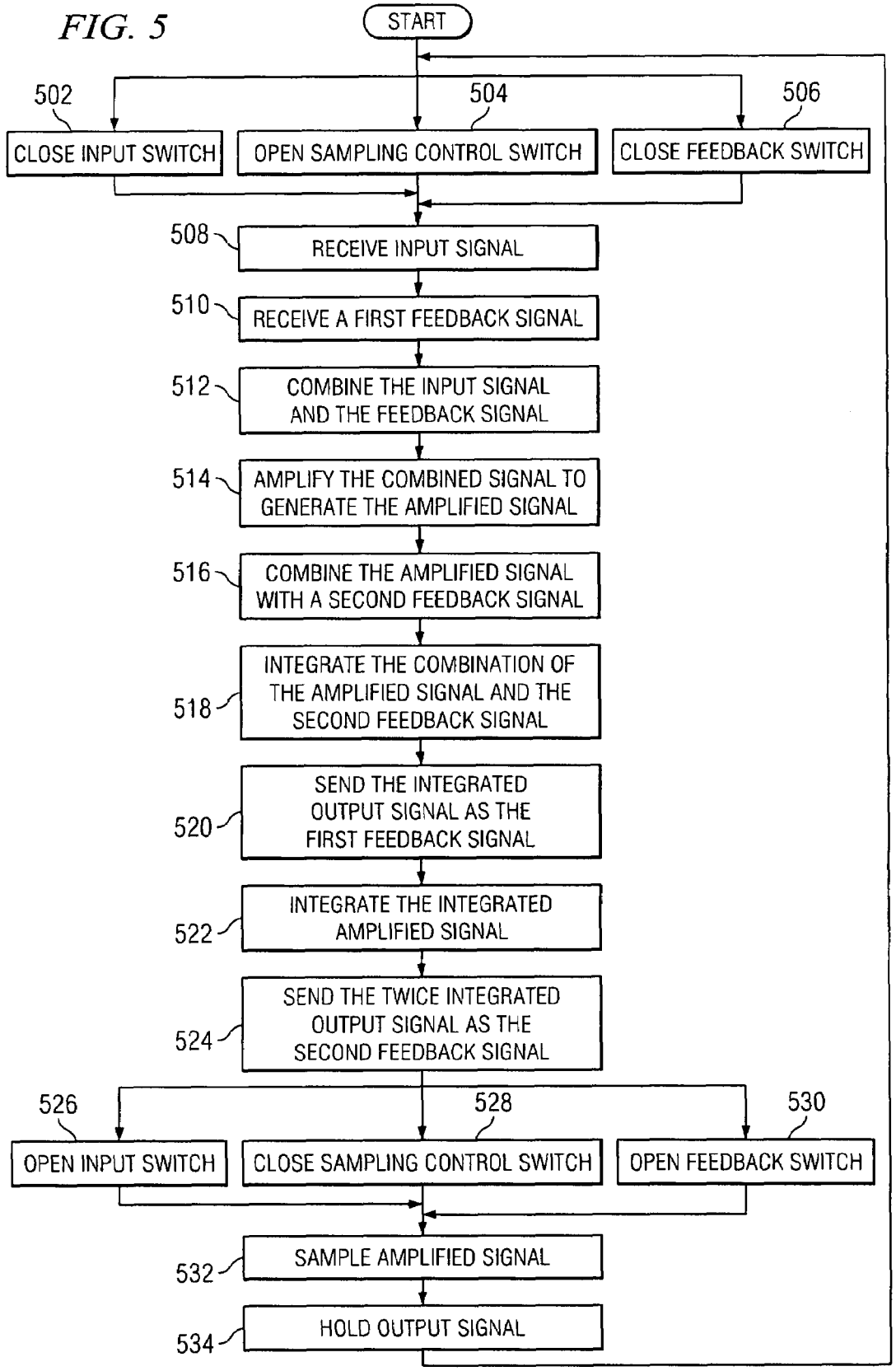
FIG. 5 is a flowchart representative of an example method that may be used to implement the example switched capacitor notch filter circuit of FIGS. 2, 3, and/or 4.

FIG. 5 is a flowchart representative of an example method to implement the example switched capacitor notch filter circuit 200 of FIGS. 2, 3, and/or 4. While the circuits of FIGS. 3 and 4 illustrate implementations of the example method of FIG. 5 in hardware, the example method may alternatively be implemented as machine accessible instructions that may be executed by a processor, a controller, and/or any other suitable control device. For example, the method of FIG. 5 may be embodied in coded instructions stored on a tangible medium such as a flash memory, a read only memory, or a random access memory, etc. Alternatively, the example flowchart of FIG. 5 may be implemented using any of a variety of ASIC(s), PLD(s), FPLD(s), discrete logic, hardware, firmware, etc. Also, the example flowchart of FIG. 5 may be implemented manually or as any combination of any of the foregoing techniques, for example, a combination of firmware, software and/or hardware. Further, although the example method of FIG. 5 is described with reference to the flowchart of FIG. 5, persons of ordinary skill in the art will readily appreciate that many other methods may be employed to implement the example scenarios of FIGS. 2, 3, and/or 4, and/or, more generally, to implement the example switched capacitor notch filter circuit 200 of FIGS. 2, 3, and/or 4. For example, the order of execution of the blocks may be changed, and/or some of the blocks described may be changed, eliminated, sub-divided, or combined. Additionally, persons of ordinary skill in the art will appreciate that the example method of FIG. 5 may be carried out sequentially and/or carried out in parallel by, for example, separate processing threads, processors, devices, circuits, etc.

The example method of FIG. 5 begins when substantially simultaneously an input switch (e.g., switch PH1B1 of FIGS. 3 and/or 4) is closed (block 502), a sampling control switch (e.g., switch PH2B6) is opened (block 504), and a feedback switch (e.g., switch PH1B3) is closed (block 506). The switched capacitor amplifier 202 of FIG. 2 (implemented in FIGS. 3, and/or 4) receives an input signal (e.g., via the connection to switch PH1B1 of FIGS. 3 and/or 4) (block 508). The switched capacitor amplifier 202 additionally receives a first feedback signal (block 510). The input signal and the first feedback signal are combined by the switched capacitor amplifier 202 (block 512). The switched capacitor amplifier 202 amplifies the combined signal to generate an amplified signal (block 514).

Next, the amplified signal is combined with a second feedback signal (block 516). This combined signal is integrated by the first integrator 206 (block 518). The result of the integration is sent to the switched capacitor amplifier 202 as the first feedback signal (block 520). In addition, the result of the integration is integrated a second time by the second integrator 208 (block 522). This twice integrated signal is sent to the first integrator 206 as the second feedback signal (block 524).

Next, substantially simultaneously, the input switch is opened (block 526), the sampling control switch is closed (block 528), and the feedback switch is opened (block 528). After the switch states have been set, a sample and hold circuit (e.g., the sample and hold 204 of FIG. 2 (implemented in FIGS. 3 and/or 4)) samples the amplified signal output from the switched capacitor amplifier 202 (block 532). The sample and hold circuit holds the sampled signal for access as the output of the switched capacitor notch filter circuit 200 (block 534). Then, control returns to block 502, block 504, and block 506 to continue handling the input signal.

While the state of additional switches in the implementations of the switched capacitor notch filter circuit illustrated in FIGS. 3 and/or 4 (e.g., switches other than the input switch (e.g., the switch PH1B1), the sample control switch (e.g., the switch PH2B6), and the feedback switch (e.g., switch PH1B3)) are not described in conjunction with FIG. 5, the forgoing description of FIG. 3 explains how these switches are controlled relative to the described switches.

Figure 6:
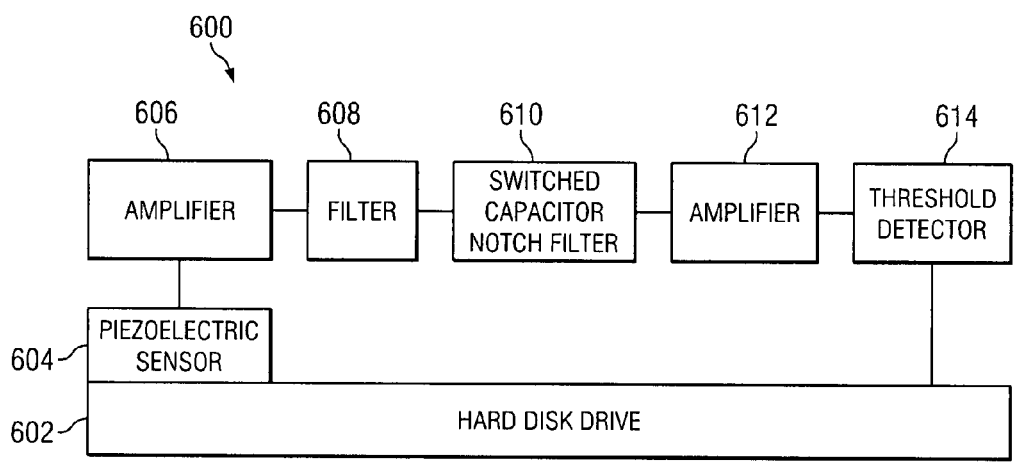
FIG. 6 is a block diagram of an example system for providing a motion detector for a hard disk drive.

FIG. 6 is a block diagram of an example system 600 for providing a motion detector for a hard disk drive 602. The example system 600 includes the hard disk drive 602, a piezoelectric sensor 604, an amplifier 606, a filter 608, a switched capacitor notch filter circuit 610, an amplifier 612, and a threshold detector 614.

The hard disk drive 602 of the illustrated example includes platters that rotate at a very high speed. As the platters are rotating, data stored on the platters is read by read/write heads that are located very close to the surface of the platters. Substantial shock (e.g., the result of dropping a laptop that includes the hard disk drive 602) may cause the read/write heads to come in contact with the platters, which can result in damage to the platters. To prevent such damage, the hard disk drive 602 includes the ability to park the read/write heads in a safety position (e.g., in such a way that a shock to the hard disk drive 602 will not cause the read/write heads to damage the platters). The hard disk drive 602 receives a control signal from the threshold detector 614, which is described in detail below, that indicates when the hard disk drive 602 should park the read/write heads.

The piezoelectric shock sensor 604 of the illustrated example is attached to hard disk drive 602 and outputs a signal relative to the amount of movement and/or vibration experienced by the piezoelectric shock sensor 604 and the hard disk drive 602. For example, when the piezoelectric shock sensor 604 is subjected to a large movement, the piezoelectric shock sensor 604 outputs a higher voltage output signal than when the piezoelectric shock sensor 604 is subjected to little or no movement. While the piezoelectric shock sensor 604 of the illustrated example is attached to the hard disk drive 602, the piezoelectric shock sensor 604 may alternatively be provided in the same enclosure (e.g., a laptop frame) as the hard disk drive 602 or may be provided in any other manner that causes the piezoelectric shock sensor 604 to experience the same movements as the hard disk drive 602.

The amplifier 606 of the illustrated example receives the signal output by the piezoelectric shock sensor 604 and amplifies the signal. For example, the piezoelectric shock sensor 604 may output a very weak signal and the amplifier 606 may amplify the signal to enable the filter 608 and the switched capacitor notch filter circuit 610 to handle the signal.

The filter 608 of the illustrated example receives the signal output by amplifier 606 and filters the signal. For example, the filter 608 of the illustrated example is a low pass filter that removes a high frequency portion of the signal. The low frequency portion of the signal provides information indicating that the system 600 has been moved (e.g., tilted). Alternatively, a high pass filter may implement the filter 608 to extract shock or vibration information.

The switched capacitor notch filter circuit 610 receives the signal output by the filter 608 and filters the signal to remove unwanted noise. For example, the piezoelectric shock sensor 604 may have a resonate frequency at which it will provide a higher gain (e.g., will be more sensitive) than at other frequencies. To reduce the effect of noise at the resonant frequency, the switched capacitor notch filter circuit 610 can be configured to notch out the frequency corresponding to the resonant frequency of the piezoelectric sensor 604. As previously described, the switched capacitor notch filter 604 can be programmed to the proper notching frequency and the proper Q by properly selecting capacitors and adjusting the trim bits of the capacitors. The switched capacitor notch filter circuit 610 may be implemented as described in FIGS. 2, 3, 4, and/or 5.

The amplifier 612 of the illustrated example receives the signal output by the switched capacitor notch filter circuit 610 and amplifies the signal. For example, the amplifier 612 amplifies the signal to levels that may be handled by the threshold detector 614.

The threshold detector 614 of the illustrated example receives the signal output by the amplifier 612 and determines if the signal indicates that the system 600 is experiencing movement that should trigger the read/write heads of the hard disk drive 602 to be parked. For example, the threshold detector 614 may detect a peak or a valley in the signal. Such extremes may indicate that the system 600 is experiencing a substantial amount of movement. When the threshold detector 614 of the illustrated example determines that the read/write heads of the hard disk drive 602 should be parked (e.g., the system 600 has been tilted or is experiencing a sudden movement), the threshold detector 614 outputs a high digital signal to the hard disk drive 602. Alternatively, the threshold detector 614 and the hard disk drive 602 may be configured such that a low digital signal indicates that the read/write heads of the hard disk drive 602 should be parked. In either case, the control signal from the threshold detector 614 will cause the hard disk drive 602 to park the read/write heads temporarily so that a sudden shock does not damage the hard disk drive 602.

From the foregoing, persons of ordinary skill in the art will appreciate that the above disclosed methods and apparatus may be realized within a single device or using two or more cooperating devices, and could be implemented by software, hardware, and/or firmware to implement the switched capacitor notch filter circuit disclosed herein.

Although certain example methods, apparatus, and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

The invention claimed is:

1. A notch filter circuit comprising:
   a switched capacitor amplifier receiving an input signal and generating an output notch signal;
   a first integrator receiving the output notch signal and generating a first feedback signal to the switched capacitor amplifier which amplifies the combined input signal and first feedback signal;
   a second integrator receiving and integrating the first feedback signal, and generating a second feedback signal to the first integrator which integrates the combined output notch signal and the second feedback signal; and
   a first switch coupling a sample and hold circuit to the output notch signal of the switched capacitor amplifier;
   wherein the sample and hold circuit stores a sample of the output notch signal when the first switch is closed, and generates the sample of the output notch signal when the first switch is opened.

2. A notch filter circuit as defined in claim 1, wherein the second integrator generates a third feedback signal to the switched capacitor amplifier.

3. A notch filter circuit as defined in claim 2, wherein the first integrator integrates the combined output notch signal, second feedback signal and the third feedback signal.

4. A notch filter circuit as defined in claim 2, wherein the third feedback signal is coupled to the switched capacitor amplifier by a switched capacitor.

5. A notch filter circuit as defined in claim 1, further comprising a low pass filter coupled to the sample and hold circuit.

6. A notch filter circuit as defined in claim 1, wherein the second feedback signal is coupled to the switched capacitor amplifier by a second switch and a capacitor.

7. A notch filter circuit as defined in claim 6, wherein the second feedback signal is coupled to a reference voltage by a third switch.

8. A notch filter circuit as defined in claim 7, wherein the first switch is opened and the second switch is closed substantially simultaneously.

9. A notch filter circuit as defined in claim 7, wherein the first switch is controlled by a first clock that is at substantially the same frequency as a second clock controlling the switched capacitor amplifier.

10. A notch filter circuit as defined in claim 1, wherein at least one of the first integrator or the second integrator is a switched capacitor integrator.

11. A notch filter circuit as defined in claim 10, wherein the switched capacitor integrator is controlled by a first clock that is at substantially the same frequency as a second clock controlling the switched capacitor amplifier.

12. A notch filter circuit as defined in claim 1, wherein the switched capacitor amplifier comprises:
   an operational amplifier having an inverting input, a non-inverting input, and an output;
   a first switched capacitor coupled with the inverting input of the operational amplifier and coupled with the input signal;
   a second switched capacitor coupled with the output of the operational amplifier and coupled with the inverting input of the operational amplifier;
   a third switched capacitor coupled with the output of the operational amplifier and coupled with the inverting input of the operational amplifier; and
   a fourth switched capacitor coupled with the inverting input of the operational amplifier and coupled with the first feedback signal.

13. A notch filter circuit as defined in claim 12, wherein the first switched capacitor comprises:
   a connection node;
   a reference voltage;
   a second switch having a first side coupled with the input signal and a second side coupled with the connection node;
   a third switch having a first side coupled with the reference voltage and a second side coupled with the connection node; and
   a capacitor having a first side coupled with the connection node and a second side coupled with the inverting input of the operational amplifier.

14. A notch filter circuit as defined in claim 1, wherein the first integrator comprises:
   an operational amplifier having an inverting input, a non-inverting input, and an output;
   a switched capacitor having a first side coupled with the notched signal and a second side coupled with the inverting input of the operational amplifier;
   a capacitor having a first side coupled with the output of the operational amplifier and a second side coupled with the inverting input of the operational amplifier.

15. A notch filter circuit as defined in claim 14, wherein the first integrator further comprises:
   a second switch interposed between the switched capacitor and the inverting input, the second switch having a first side coupled with the capacitor and having a second side coupled with the inverting input of the operational amplifier;
   a third switch having a first side coupled with the capacitor and the first side of the second switch and having a second side coupled with the second feedback signal.

16. A notch filter circuit as defined in claim 1, further comprising a second switch interposed between the input signal and the switched capacitor amplifier, wherein the first switch is opened and the second switch is closed substantially simultaneously.

17. The notch filter circuit as defined in claim 1 to be used in a hard disk drive wherein the notch filter circuit is coupled to:
   a sensor responsive to a shock detection to generate a movement signal of an amplitude corresponding to the intensity of the shock, and upon receiving the movement signal as an input signal, the notch filter circuit generates an output notch signal; and
   a threshold detector responsive to the output notch signal to generate a control signal to park a head of the hard disk drive.

18. A method for filtering a signal, the method comprising:
   receiving an input signal;
   amplifying the input signal and a first feedback signal to create an amplified signal using a switched capacitor amplifier;
   integrating the amplified signal to create the first feedback signal using a first integrator;
   integrating the first feedback signal to create a second feedback signal using a second integrator;
   substantially simultaneously coupling the amplified signal with a sample and hold circuit and decoupling the switched capacitor amplifier from the first feedback signal;
   after coupling the amplified signal with the sample and hold circuit, sampling the amplified signal to create a sampled signal using the sample and hold circuit; and
   outputting the sampled signal.

* * * * *